(12) United States Patent
Yan

(10) Patent No.: US 12,191,299 B2
(45) Date of Patent: Jan. 7, 2025

(54) METHOD OF FABRICATING SEMICONDUCTOR DEVICE

(71) Applicant: Fujian Jinhua Integrated Circuit Co., Ltd., Quanzhou (CN)

(72) Inventor: Yifei Yan, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 18/528,748

(22) Filed: Dec. 4, 2023

(65) Prior Publication Data
US 2024/0120329 A1 Apr. 11, 2024

Related U.S. Application Data

(62) Division of application No. 17/728,929, filed on Apr. 25, 2022, now Pat. No. 11,887,977.

(30) Foreign Application Priority Data

Mar. 24, 2022 (CN) .......................... 202210303405.7
Mar. 24, 2022 (CN) .......................... 202220676342.5

(51) Int. Cl.
*H01L 27/02* (2006.01)
*H01L 21/033* (2006.01)
*H01L 21/762* (2006.01)
*H01L 23/00* (2006.01)

(52) U.S. Cl.
CPC ...... *H01L 27/0207* (2013.01); *H01L 21/0335* (2013.01); *H01L 21/0337* (2013.01); *H01L 21/0338* (2013.01); *H01L 21/76229* (2013.01); *H01L 23/562* (2013.01)

(58) Field of Classification Search
CPC ............ H01L 21/0335; H01L 21/0337; H01L 21/0338
See application file for complete search history.

(56) References Cited

U.S. PATENT DOCUMENTS 9,704,816 B1 7/2017 Huang
2002/0005542 A1 1/2002 Hayano
2016/0233297 A1* 8/2016 Tomoyama ........... H01L 21/762

FOREIGN PATENT DOCUMENTS

CN 112271179 1/2021

* cited by examiner

*Primary Examiner* — Walter H Swanson
(74) *Attorney, Agent, or Firm* — Winston Hsu

(57) ABSTRACT

The present disclosure provides a method of fabricating a semiconductor device, which includes a substrate, an active structure, and a shallow trench isolation. The active structure is disposed in the substrate and includes a first active area, a second active area disposed outside the first active area, and a third active area disposed outside the second active area. The shallow trench isolation is disposed in the substrate to surround the active structure. Through the second active area and the third active of the active structure, the structural stability of the semiconductor device may be enhanced to improve the stress around the semiconductor device, thereby preventing from structural collapse or deformation.

10 Claims, 6 Drawing Sheets

METHOD OF FABRICATING SEMICONDUCTOR DEVICE

CROSS REFERENCE TO RELATED APPLICATIONS

This application is a division of U.S. application Ser. No. 17/728,929, filed on Apr. 25, 2022. The content of the application is incorporated herein by reference.

BACKGROUND OF THE INVENTION

1. Field of the Invention

The present disclosure generally relates to a semiconductor device and a method of fabricating the same, and more particularly, to a semiconductor device having active areas and shallow trench isolations, and a method of fabricating the same.

2. Description of the Prior Art

With the miniaturization of semiconductor devices and the complexity of integrated circuits, the size of elements is continuously shrinking and the structure is constantly changing. Therefore, maintaining the performance of small-sized semiconductor elements is the standard purpose of the present industry. In the semiconductor fabricating process, most of the active areas are defined on the substrate as a bass element, and then, the required elements are further formed on the active areas. Generally, the active areas are plural patterns formed within the substrate through the photolithography and etching processes. However, due to the sized-shrinking requirements, the width of the active areas has been gradually reduced, and the pitch between the active areas has also been gradually reduced thereby, so that, the fabricating process of active areas encounters plenty limitations and challenges that fails to meet the practical product requirements.

SUMMARY OF THE INVENTION

One of the objectives of the present disclosure provides a method of fabricating a semiconductor device, which includes a first active area, a second active area disposed outside the first active area, and a third active area disposed outside the second active area, so as to effectively improve the structural strengthen and the stresses around the semiconductor device, and to avoid the semiconductor structural collapse or damages.

To achieve the purpose described above, one embodiment of the present disclosure provides a method of fabricating a semiconductor device, including the following steps. Firstly, a substrate is provided, and an active structure and a shallow trench isolation are formed in the substrate, with the shallow trench isolation surrounding the active structure. The active structure includes a first active area including a plurality of active area units being parallel extended along a first direction, a second active area disposed outside the first active area, and a third active area disposed outside the second active area. The second active area and the third active area respectively include a first edge extending along a second direction and a second edge extending along a third direction, and the first edge directly connects to the second edge, wherein the second direction intersects and is not perpendicular to the first direction, and the second direction is perpendicular to the third direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic diagrams illustrating a fabricating process of a semiconductor device according to a first embodiment in the present disclosure, wherein:

FIG. 1 is a schematic top view of a semiconductor device while performing a self-aligned double patterning process;

FIG. 2 is a schematic cross-sectional view taken along a cross-line A-A' in FIG. 1;

FIG. 3 is a schematic top view of a semiconductor device after forming a photoresist layer;

FIG. 4 is a schematic top view taken of a semiconductor device after performing an etching process;

FIG. 5 is a schematic cross-sectional view taken along a cross-line A-A' in FIG. 4;

FIG. 6 is a schematic top view of a semiconductor device after forming another photoresist layer;

FIG. 7 is a schematic cross-sectional view taken along a cross-line A-A' in FIG. 6;

FIG. 8 is a schematic top view of a semiconductor device after forming an active structure and a shallow trench isolation; and FIG. 9 is a schematic cross-sectional view taken along a cross-line A-A' in FIG. 8.

FIG. 10 to FIG. 11 are schematic diagrams illustrating a fabricating process of a semiconductor device according to a second embodiment in the present disclosure, wherein:

FIG. 10 is a schematic top view of a semiconductor device after forming a photoresist layer; and FIG. 11 is a schematic top view of a semiconductor device after forming an active structure and a shallow trench isolation.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Please refer to FIG. 1 to FIG. 9, which illustrate schematic diagrams of a fabricating process of a semiconductor device 300 according to the first embodiment in the present disclosure, with FIG. 1, FIG. 3, FIG. 4, FIG. 6 and FIG. 8 respectively illustrating a top view of the semiconductor device 300 at various stages of formation, and with FIG. 2, FIG. 5, FIG. 7, and FIG. 9 respectively illustrating a cross-sectional view of the semiconductor device 300 at various stages of formation. Firstly, a substrate 100 is provide, such as a silicon substrate, silicon containing substrate (such as SiC or SiGe), or a silicon-on-insulator (SOI) substrate. Next, at least one isolation structure is formed in the substrate 100, for example is a shallow trench isolation (STI) 202, to define an active structure 200 in the substrate 100. The formation of the active structure 200 is accomplished by a photolithography process and an etching process, otherwise, by a self-aligned double patterning (SADP) process or a self-aligned reverse patterning (SARP) process, but not limited thereto.

Figure 1:
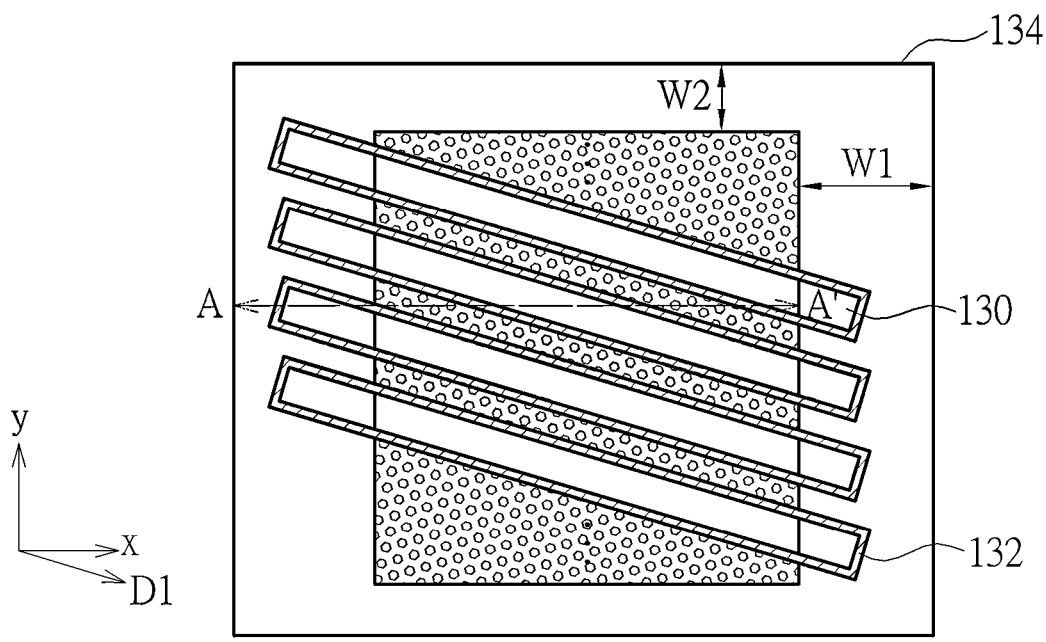
Figure 2:
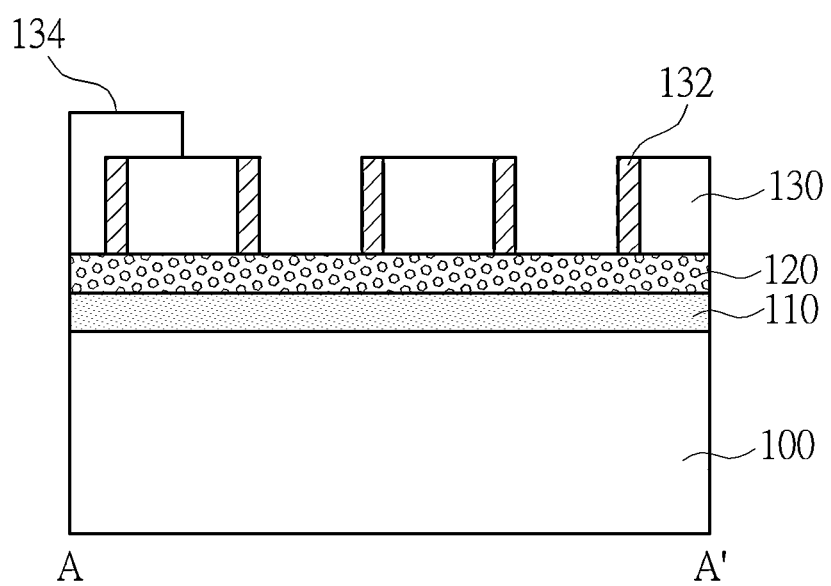

In the present embodiment, the formation of the active structure 200 is preferably accomplished by the self-aligned double patterning process, and which includes but is not limited to be the following steps. Firstly, as shown in FIG. 1 and FIG. 2, a first mask layer 110, a second mask layer 120, and a plurality of third mask 130 are sequentially formed on the substrate 100. The first mask layer 110, and the second mask layer 120 may respectively include a monolayer structure or a multilayer structure, for example including a material like oxide or nitride. Preferably, the first mask layer 110 includes a polysilicon layer, and the second mask layer 120 may include a nitride layer, but not limited thereto. Precisely, each of the mask patterns 130 is separately disposed on the second mask layer 120 by the same pitch, and is extended along a first direction D1, wherein the first direction D1 is for example intersects and not perpendicular to the y-direction or the x-direction, as shown in FIG. 1. In one embodiment, the formation of the mask patterns 130 is for example accomplished by a standard gate process, so that, the material of each of the mask patterns may include polysilicon or other suitable material, but not limited thereto.

As shown in FIG. 1 and FIG. 2, a deposition process and an etching bask process are sequentially performed to form a spacer 132 on each of the mask patterns 130, with the spacer 132 surrounding the sidewalls of each mask patter 130. The spacer 132 for example includes silicon nitride or other materials having etching selectivity related to the mask patterns 130. It is noteworthy that, in the present embodiment, each of the mask patterns 130 preferably includes a rectangular shape, so that, the spacer 132 surrounded each of the mask patterns 130 may therefore perform in a closed rectangular-framed shape from a top view as shown in FIG. 1, but is not limited thereto. People well skilled in the art should fully understand that the mask patterns may also include other shapes based on practical product requirements, so that, the spacer may also perform in a square framed shape, circular shape, a racetrack shape, or the like.

Then, a photoresist layer 134 (for example including a suitable photoresist material) is formed on the substrate 100, covering the mask patterns 130 and the spacer 132, especially on two ends of each of the mask patterns 130 and two ends of each spacer 132, as shown in FIG. 1. It is noted that, the photoresist layer 134 for example also includes the closed rectangular-framed shape, and which includes a portion extended in a second direction (namely, the y-direction) and a portion extended in a third direction (namely, the x-direction), with the second direction being perpendicular to the third direction. The portion extended in the second direction (namely, the y-direction) has a width W1 which is substantially the same as a width W2 of the portion extended in the third direction (namely, the x-direction).

Figure 3:
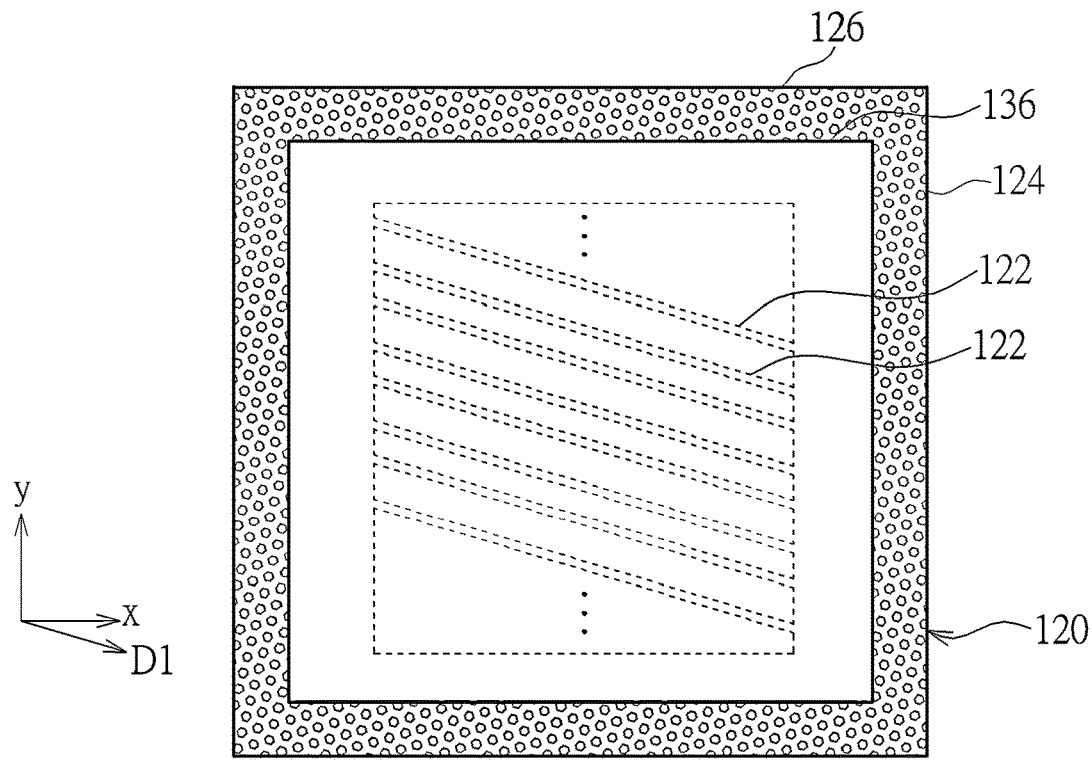

Then, the mask patterns 130 are completely removed, and an etching process is performed through the photoresist layer 134 and the spacer 132, to transfer the patterns of the photoresist layer 134 and the spacer 132 into the second mask layer 120 underneath to form the structure as shown in FIG. 3. Precisely speaking, after performing the etching process through the photoresist layer 134 and the spacer 132, the second mask layer 120 is patterned to form a plurality of first patterns 122 which are parallel extended along the first direction D1, a plurality of second patterns 124 which are parallel extended along the second direction (namely, the y-direction), and a plurality of third patterns 126 which are parallel extended along the third direction (namely, the x-direction), wherein each of the first patterns 122 directly contacts the second patterns 124 or the third patterns 126. It is noted that, the second patterns 124 and the third patterns 126 have the corresponding shape of the photoresist layer 134, so as to together present in a closed rectangular-frame shape, disposed outside all of the first patterns 122. Also, each of the second patterns 124 and each of the third patterns 126 respectively include the same width W1 as the portion extended in the second direction (namely, the y-direction) and the same width W2 as the portion extended in the third direction (namely, the x-direction), as shown in FIG. 3. In one embodiment, the width W1 may be the same as the width W2, but is not limited thereto.

As shown in FIG. 3, after removing the photoresist layer 134, a photoresist layer 136 (for example including a suitable photoresist material) is then formed on the substrate 100, covering the first patterns 122, the second patterns 124 and the third patterns 126 of the second mask layer 120. It is noted that, the photoresist layer 136 completely covers all of the first patterns 122, and partially covers the second patterns 124 and the third patterns 126. With such arrangement, the partial width W1 of each second pattern 124 or the partial width W2 of each third pattern 126 may be exposed from the photoresist layer 136, for example being about half of the width W1, or half of the width W2. People well skilled in the art should fully understand that the portion of the photoresist layer 136 either covering or uncovering on the width W1 of each second pattern 124, or the width W2 of each third pattern 126 are not limited to the aforementioned ratio, and which may be further adjusted based on practical product requirements.

Figure 4:
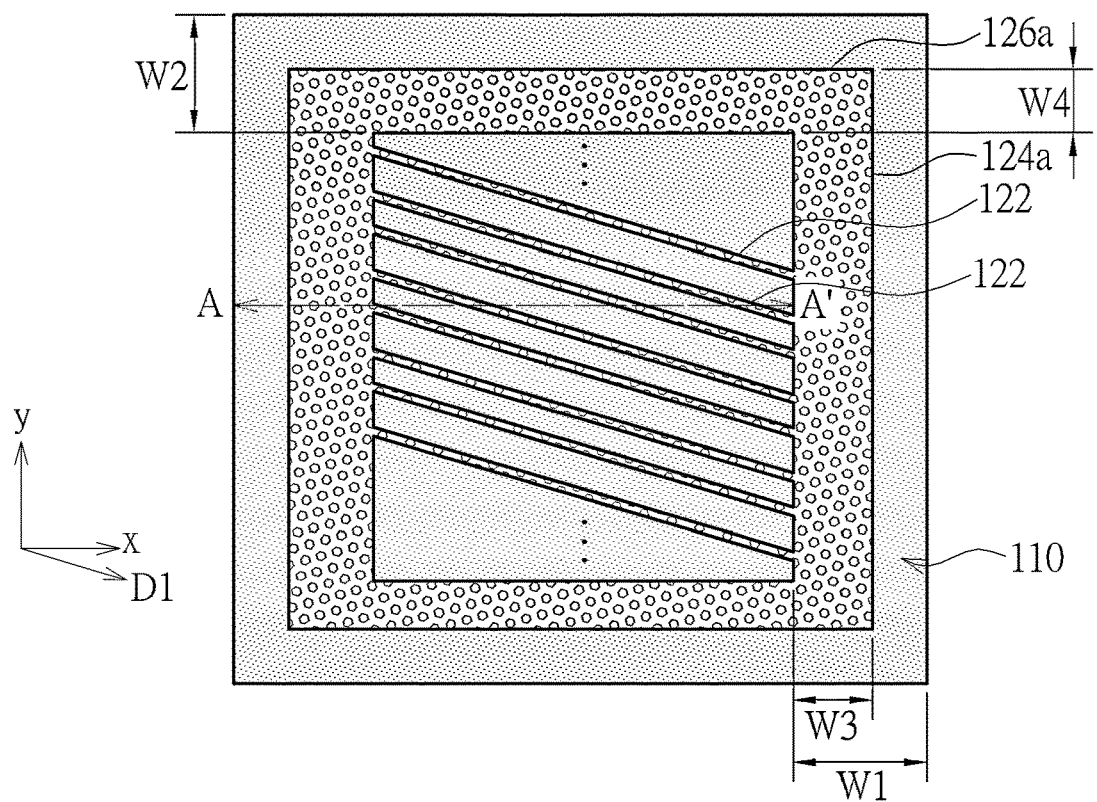
Figure 5:
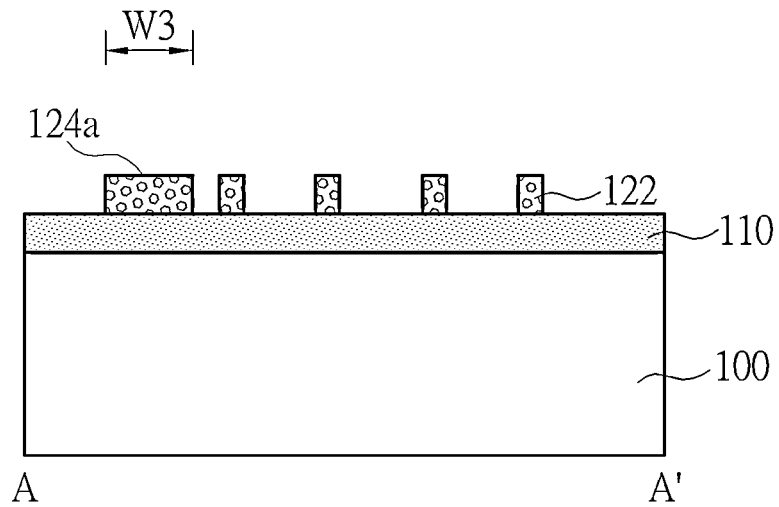

As shown in FIG. 4 to FIG. 5, an etching process is performed through the photoresist layer 136, to partially remove the second patterns 124 and the third patterns 126 of the second photoresist layer 120. Then, the photoresist layer 136 is completely removed. Accordingly, the second patterns 124 and the third patterns 126 may be further patterned into second patterns 124a and third patterns 126a, with the width W1 of each second pattern 124 being shrunk into a width W3, and with the width W2 of each third pattern 126 being shrunk into a width W4. In addition, after performing the etching process through the photoresist layer 136, a portion of the first mask layer 110 disposed underneath may be exposed thereby, as shown in FIG. 4.

Figure 6:
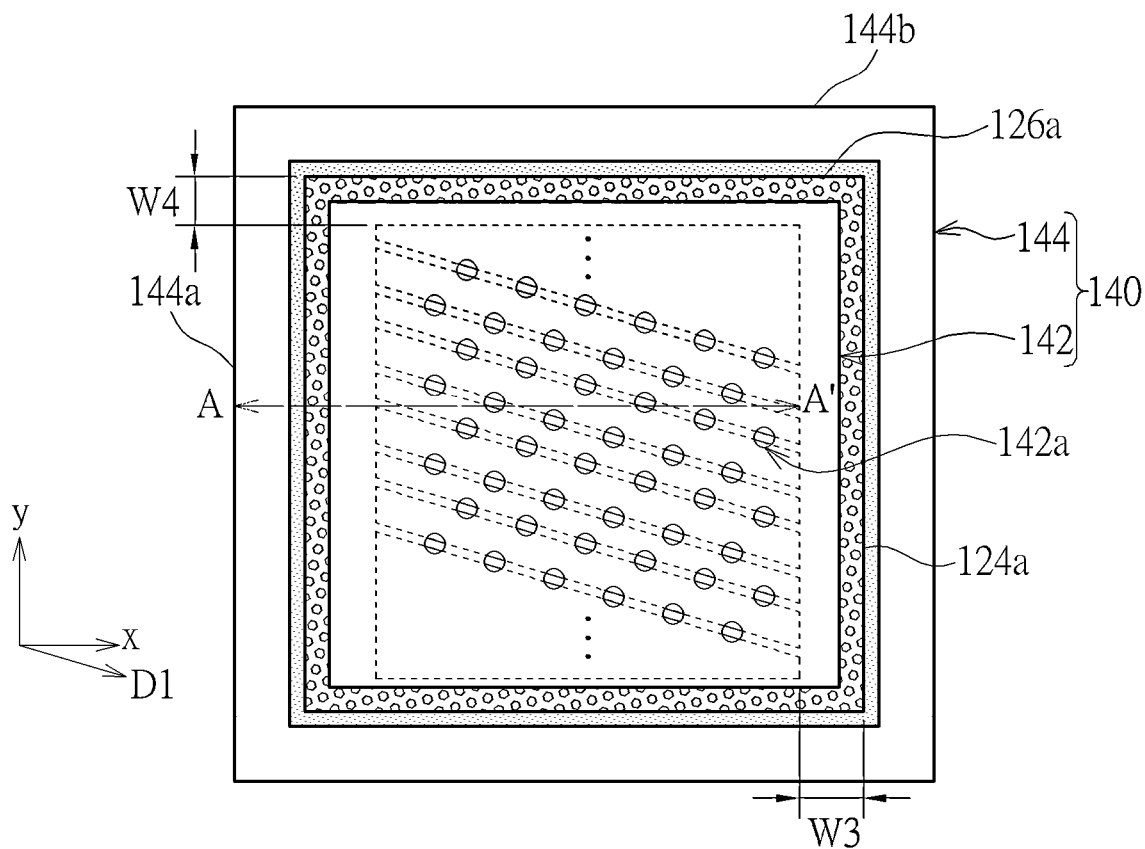
Figure 7:
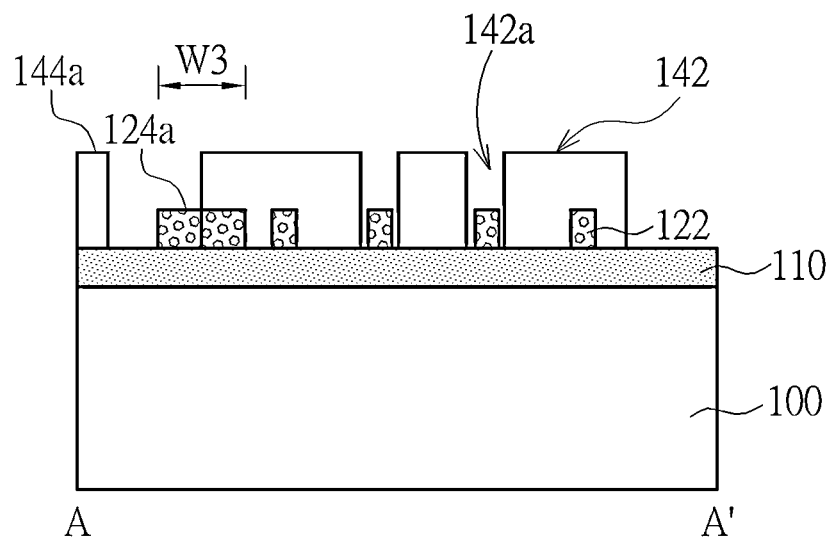

As shown in FIG. 6 to FIG. 7, a photoresist layer 140 (for example including a suitable photoresist material) is formed on the substrate 100, covering the first patterns 122, the second patterns 124a, and the third patterns 126a. Precisely speaking, the photoresist layer 140 includes a first photoresist layer 142 and a second photoresist layer 144, wherein the first photoresist layer 142 entirely covers all of the first patterns 122 and partially covers the second patterns 124a and the third patterns 126a, to expose the partial width W3 of each second pattern 124 or the partial width W4 of each third pattern 126, for example being about half of the width W3, or half of the width W4, but is not limited thereto. Also, the first photoresist layer 142 further includes a plurality of separately and alternately arranged openings 142a, which are in aligned with a portion of each first pattern 122 to exposed the portion of each first pattern 122 therefrom, as shown in FIG. 6 and FIG. 7. On the other hand, the second photoresist layer 144 is disposed outside the first photoresist layer 142, to partially cover the first mask layer 110 exposed at the outer side. It is noted that, the second photoresist layer 144 does not contact the first photoresist layer 142, and the second photoresist layer 144 is spaced apart from the first photoresist layer 142 to expose a portion of the second mask layer 120 (including a portion of the second patterns 124a and a portion of the third patterns 126a) and a portion of the first mask layer 110, as shown in FIG. 6 and FIG. 7. Furthermore, it is also noted that the second photoresist layer 144 includes a first portion 144a extended in the second direction (namely, the y-direction) and a second portion 144b extended in the third direction (namely, the x-direction), and preferably, the first portion 144a extended in the second direction (namely, the y-direction) and a second portion 144b extended in the third direction (namely, the x-direction) also together present in the closed rectangular-framed shape, so as to be disposed outside the first photoresist layer 142 by the same pitch, but not limited thereto.

Figure 8:
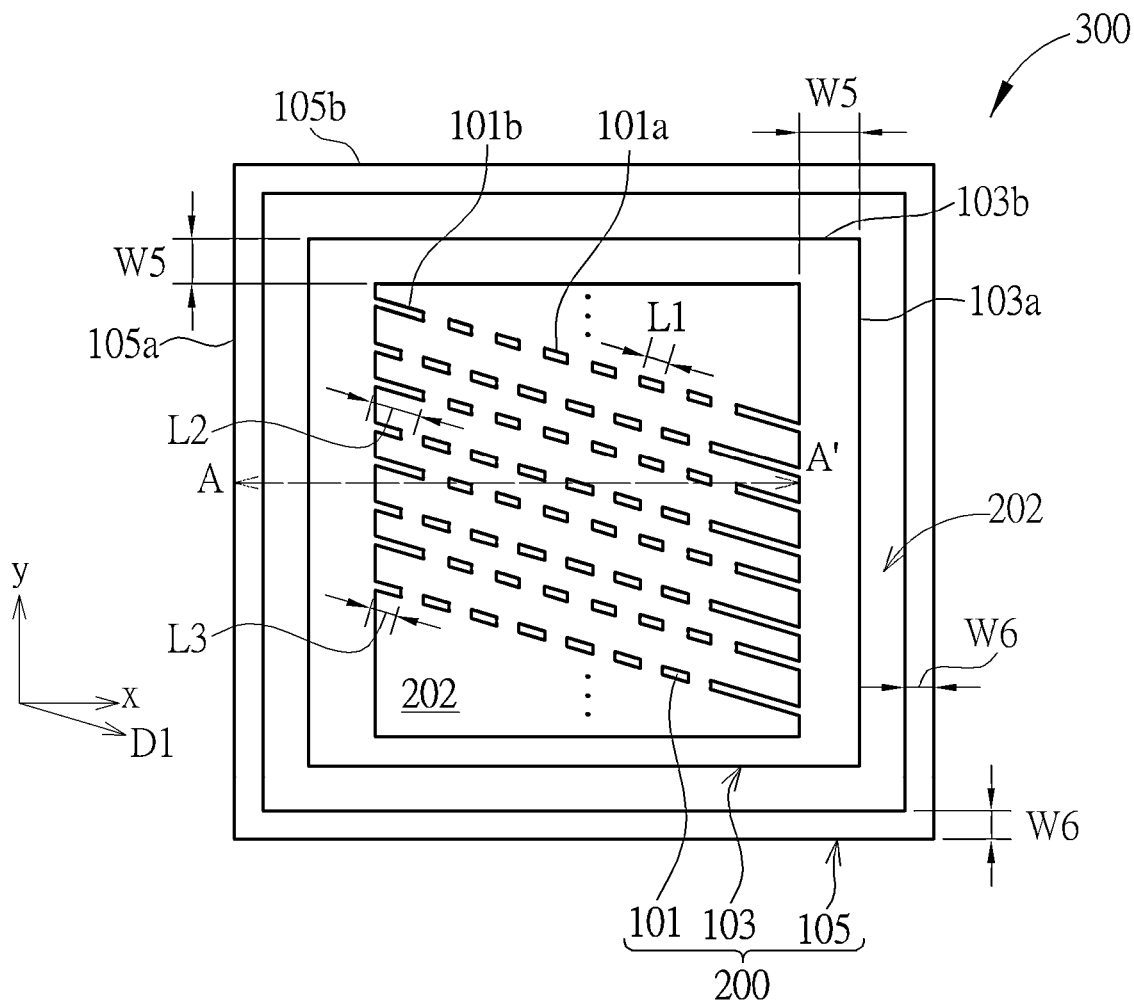
Figure 9:
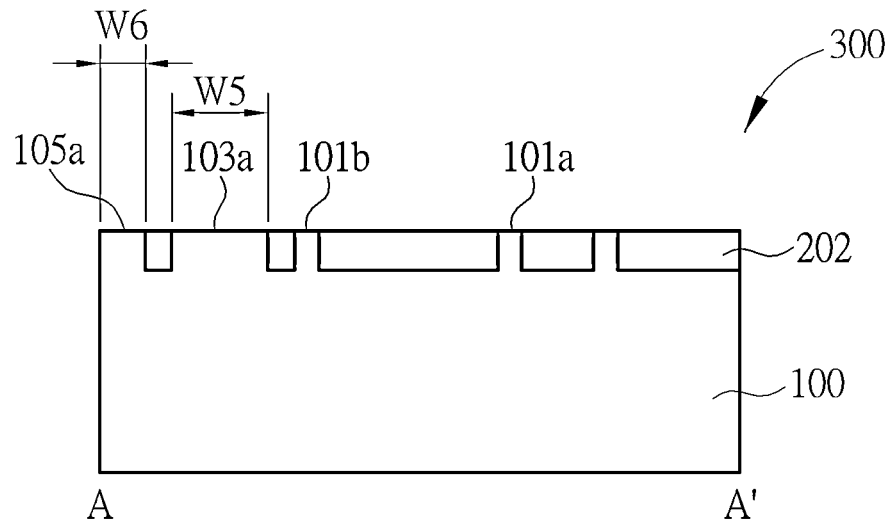

After that, an etching process is performed through the photoresist layer 140, to remove the exposed first patterns 122, the exposed second patterns 124a and the exposed third patterns 126a, the patterns of the photoresist layer 140 (namely, the pattern of the second photoresist layer 144) is firstly transferred into a portion of the first mask layer 110 underneath, and the photoresist layer 140 is completely removed, to expose the first mask layer 110, the rest portion of the first patterns 122, the rest portion of the second patterns 124a and the rest portion of the third patterns 126a. Next, another etching process is performed through the rest portion of the first patterns 122, the rest portion of the second patterns 124a, the rest portion of the third patterns 126a, and the patterned first mask layer 110, to pattern the substrate 100 underneath, to form a plurality of shallow trenches 102 in the substrate 100. In this way, the active structure 200, au ne defined in the substrate 100, and an insulating material (not shown in the drawings) such as silicon oxide, silicon nitride, or silicon oxynitride is filled in the shallow trench 102, to form the shallow trench isolation 202 having coplanar top surface with the top surface of the substrate 100, as shown in FIG. 8 and FIG. 9.

Precisely speaking, the active structure 200 includes the first active area 101, the second active area 103, and the third active area 105 sequentially disposed from inner side to the outer side, with the second active area 103 including a closed pattern disposed outside the first active area 101, and the third active area 105 also including a closed pattern disposed outside the second active area 103. Accordingly, the second active area 103 may be disposed between the third active area 105 and the first active area 101, and the shallow trench isolation 202 surrounds the active structure 200, with a portion of the shallow trench isolation 202 being disposed between the second active area 103 and the third active area 105, and between the second active area 103 and the first active area 101. In the present embodiment, the first active area 101 is entirely surrounded by the second active area 103, and both of the first active area 101 and second active area 103 are entirely surrounded by the third active area 105, as shown in FIG. 8, but is not limited thereto. The first active area 101 further includes a plurality of active area units 101a, 101b parallel extended along the first direction D1, wherein the active area units 101a, 101b are alternately and sequentially arranged along the first direction D1 into a plurality of rows, thereby presenting a particular arrangement, such as an array arrangement as shown in FIG. 8, but not limited thereto. It is noted that, a first portion of the active area units 101a has the same length L1 in the first direction D1, and a second portion of the active area units 101b respectively includes a different length from each other, which is also different from the length L1, for example being a length L2 greater than the length L1, or being a length L3 less than the length L1.

Preferably, the second portion of the active area units 101b are disposed at two opposite sides of the first active area units 101a in the third direction (namely, the x-direction), the second portion of the active area units 101b may directly contact the second active area 103 disposed outside all of the active area units 101a, 101b, and the first portion of the active area units 101a does not directly contact the second active area 103. In the preset embodiment, the second active area 103 further includes a plurality of first edges 103a extended along the second direction (namely, the y-direction), and a plurality of second edges 103b extended along the third direction (namely, the x-direction), wherein each of the first edges 103a is in connection with each of the second edges 103b to present in the closed rectangular-framed shape, as shown in FIG. 8. In addition, the first edges 103a and the second edge 103b may include the same width W5 with each other, for example being about a half of the width W3, W4 of each second pattern 124a or each third pattern 126a, but is not limited thereto. On the other hand, the third active area 105 also includes a plurality of first edges 105a extended along the second direction (namely, the y-direction), and a plurality of second edges 105b extended along the third direction (namely, the x-direction), wherein each of the first edges 105a is in connection with each of the second edges 105b to also present in the closed rectangular-framed shape, as shown in FIG. 8. The first edges 105a and the second edge 105b may also include the same width W6 with each other, and the width W5 of each first edges 103a or each second edges 103b of the second active area 103 is greater than the width W6 of each first edge 105a or each second edge 105b of the third active area 105.

Through these arrangements, the semiconductor device 300 of the first embodiment in the present disclosure is accomplished, and which includes the first active area 101, the second active area 103, and the third active area 105 sequentially disposed from the inner side to the outer side. In this way, the second active area 103 enables to uniformly disperse the stresses suffered from first active area 101 and the shallow trench isolation 202 through the second portion of the active area units 101b in connection with the second active area 103, thereby further stabilizing the structure of the active area units 101a, 101b via the rectangular frame surrounded at the outer side of the active area units 101a, 101b. Accordingly, any structural collapse or damages happened on the active area units 101a, 101b may be sufficiently avoided. Also, the third active area 105 disposed at the outer side of both of the second active area 103 and the first active area 101 may further protect the inner structure, so as to maintain the structural integrity, and to avoid the possible deformation.

However, people in the art should fully realize that the semiconductor device and the fabricating method thereof are not be limited to aforementioned embodiment and may include other examples or may be achieved through other strategies to meet practical product requirements. The following description will detail the different embodiments of the semiconductor device and the fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 10:
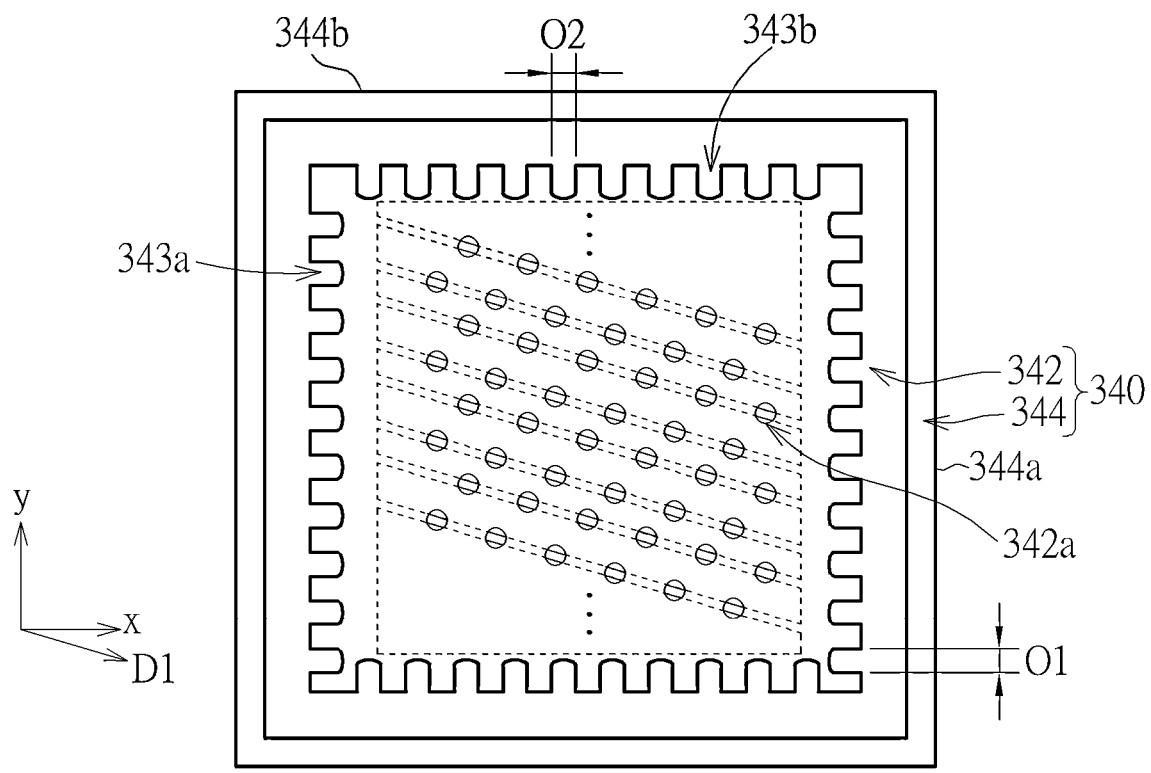
Figure 11:
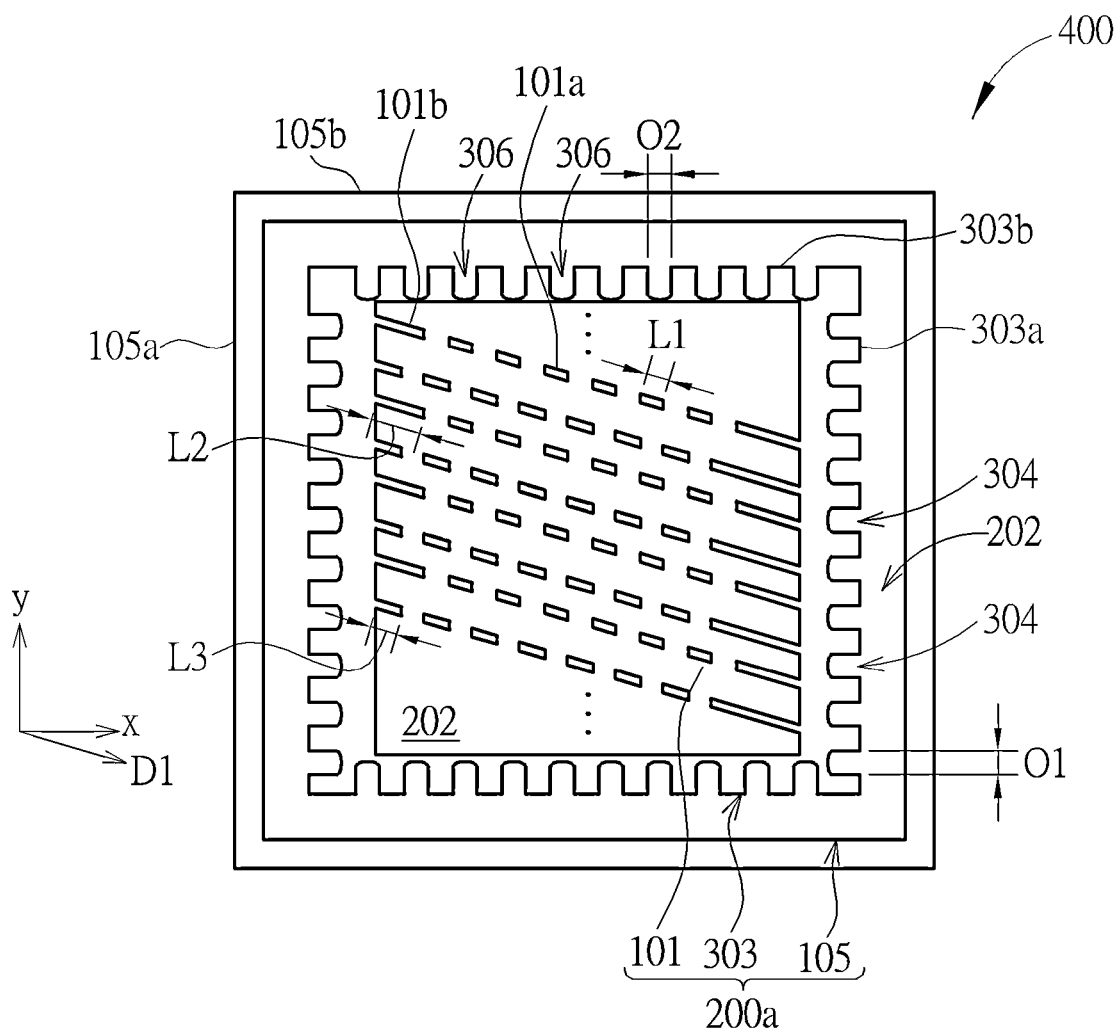

Please refer to FIG. 10 to FIG. 11, which illustrate a fabricating method of a semiconductor device 400 according to the second embodiment of the present disclosure. In the present embodiment, the formal steps of fabricating the semiconductor device 400 are substantially the same as those of the aforementioned first embodiment as shown in FIG. 1 to FIG. 5, and which may not be redundantly described hereinafter. The difference between the fabricating method of the preset embodiment and the fabricating method of the aforementioned first embodiment is in that a photoresist layer 340 is formed on the substrate 100 to cover first patterns 122, second patterns 124a, and third patterns 126a of the second mask layer 120, and a first photoresist layer 342 of the photoresist layer 340 further includes a plurality of openings 342a disposed at the inner side and a plurality of trenches 343a, 343b disposed at the outer side and faced outwardly at the same time.

Precisely speaking, the photoresist layer 340 includes the first photoresist layer 342 and a second photoresist layer 344, wherein the first photoresist layer 342 includes a plurality of edges (not shown in the drawings) extended along the second direction (namely, the y-direction), and a plurality of edges (not shown in the drawings) extended along the third direction (namely, x-direction), thereby presenting in a square shape to cover all of the first patterns 122, and to partially cover the second patterns 124a and the third patterns 126a. With such arrangement, the partial width W3 of each second pattern 124a or the partial width W4 of each third pattern 126a may be exposed from the photoresist layer 342, for example being about half of the width W3, or half of the width W4, but not limited thereto. Furthermore, the openings 342a are separately and alternately arranged with each other along the first direction D1, to respectively expose a portion of each of the first patterns 122 underneath, as shown in FIG. 10. The trenches 343a, 343b of the first photoresist layer 342 are sequentially arranged on the corresponding edges of the first photoresist layer 342 along the second direction (namely, the y-direction), or along the third direction (namely, the x-direction), to partially expose the second patterns 124a or the third patterns 126a underneath. Preferably, the diameter (not shown in the drawings) of each of the trenches 343a, 343b is different from the diameter of each opening 342a (not shown in the drawings), and preferably, the diameter of each trench 343a, 343b is greater than that of each opening 342a, but not limited thereto. It is noted that, each of the trenches 343a, 343b is disposed toward the direction which is away from the openings 342a, namely, being disposed to face to the second photoresist layer 344, as shown in FIG. 10. In one embodiment, each trench 343a may include the same diameter O1 in the second direction (namely, the y-direction), and each trench 343b also includes the same diameter O2 in the third direction (namely, the x-direction), wherein, the diameter O1 may be optionally the same as the diameter O2, but not limited thereto.

On the other hand, the second photoresist layer 344 includes a first portion 344a extended along the second direction (namely, the y-direction), and a second portion 344b extended along the third direction (namely, the x-direction), to also present in the closed rectangular-framed shape. Then, the second photoresist layer 344 may be disposed outside the first photoresist layer 342, to partially cover the first mask layer 110 disposed at the outermost portion of the first mask layer 110. It is noted that, the second photoresist layer 344 does not contact the first photoresist layer 342, and the second photoresist layer 344 and the first photoresist layer 342 are spaced apart from each other to expose a portion of the second mask layer 120 (including a portion of the second patterns 124a and a portion of the third patterns 126a) and a portion of the first mask layer 110, as shown in FIG. 10.

Then, an etching process is performed through the photoresist layer 340, to remove the exposed first patterns 122, the exposed second patterns 124a, and the exposed third patterns 126a, and to firstly transfer the patterns of the photoresist layer 340 (namely the pattern of the second photoresist layer 344) into a portion of the first mask layer 110. Following these, the photoresist layer 340 is completely removed, to expose the first mask layer 110, the rest portion of the first patterns 122, the rest portion of the second patterns 124a, and the rest portion of the third patterns 126a. Next, another etching process is performed through the rest portion of the first patterns 122, the rest portion of the second patterns 124a, the rest portion of the third patterns 126a, and the patterned first mask layer 110, to pattern the substrate 100 underneath, to form a plurality of shallow trenches (not shown in the drawings) in the substrate 110. Accordingly, an active structure 200a may be defined in the substrate 110, and a deposition process and an etching process are sequentially performed to form the shallow trench isolation 202 filled in the shallow trenches, thereby accomplishing the semiconductor device 400 of the present embodiment, as shown in FIG. 11.

The structure of the semiconductor device 400 is substantially the same as the structure of the semiconductor device 300 in the first embodiment, and which includes the substrate 110, the active structure 200a, and the shallow trench isolation 202. The active structure 200a also includes the first active area 101 (including active area units 101a, 101b), a second active area 303 having a closed pattern, and the third active area 105 also having a closed pattern being sequentially disposed from the inner side to the outer side, and all the similarities between the active structure 200 and the active structure 200a will but be redundantly described hereinafter. It is noted that, the second active area 303 of the present embodiment further includes a plurality of first edges 303a extending along the second direction (namely, the y-direction), and a plurality of second edges 303b extending along the third direction (namely, the x-direction), with each first edge 303a in connection with each second edge 303b to present in the closed rectangular-framed shape. Also, the trenches 304 disposed outwardly to the outer side are additionally disposed on each first edge 303a, with each of the trenches 304 being faced to each first edge 105a of the third active area 105 and having the same diameter O1 in the second direction. The trenches 306 disposed outwardly to the outer side are additionally disposed on each second edge 303b, with each of the trenches 306 being faced to each second edge 105b of the third active area 105 and having the same diameter O2 in the third direction. In one embodiment, the diameter O1 of each trench 304 may be the same as the diameter O2 of each trench 306, but is not limited thereto. In another embodiment, the diameter O1 of each trench 304 may also be different form the diameter O2 of each trench 306, or the trenches 304 and/or the trenches 306 may also include different diameters with each other.

In this way, the first edges 303a and the second edges 303b of the second active area 303 may respectively include a battlement-shaped contour which is preferably closed the third active area 105 disposed at the outer side, and far away from the first active area 101 disposed at the inner side. In other words, in the present embodiment, the second portion of the active area units 101b directly contact one end of the first edges 303a without having the battlement-shaped contour, and another end of the first edges 303a does not contact any active area units 101a, 101b. with such arrangement, the second active area 303 also enables to uniformly disperse the stresses suffered from first active area 101 and the shallow trench isolation 202 through the second portion of the active area units 101b which are in connection with the second active area 303, and to stabilize the structure of the active area units 101a, 101b through the rectangular frame surrounding at the outside the active area units 101a, 101b, thereby effectively avoiding any structural collapse or damages happened on the active area units 101a, 101b. Additionally, the trenches 304, 306 faced outwardly on the second active 303 may further disperse the stresses suffered from first active area 101 and the shallow trench isolation 202 to the outer side, to as to protect the integrity of the inner structure, and to prevent from possible deformation of the active area units 101a, 101b. The formation of the trenches 304, 306 may be further integrated in the formation of the active structure 200a, so that, and additional mask is not requested in the fabricating method of the present disclosure. In this way, the semiconductor device 400 is formed with improved structure and performance under a simplified process flow and a reduced cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a substrate;
   sequentially forming a first mask layer and a second mask layer on the substrate;
   performing a self-aligned double patterning process to form a plurality of mask patterns parallel extended along a first direction on the second mask layer, and forming a spacer on the second mask layer;
   forming a photoresist layer on the second mask layer, the photoresist layer overlapping with two opposite ends of each of the mask patterns;
   performing an etching process through the photoresist layer and the mask patterns, to form a plurality of first patterns, a plurality of second patterns, and a plurality of third patterns, the first patterns parallel extending along the first direction, the second patterns extending along a second direction, the third patterns extending along a third direction, and each of the first patterns directly contacting the second patterns or the third patterns; and
   forming an active structure and a shallow trench isolation in the substrate, the active structure comprising:
      a first active area, comprising a plurality of active area units being parallel extended along the first direction; and
      a second active area, disposed outside the first active area,
      the second active area the second active area comprising a first edge extending along the second direction and a second edge extending along the third direction, and the first edge directly connected to the second edge, wherein the second direction intersects and is not perpendicular to the first direction, and the second direction is perpendicular to the third direction.

2. The method of fabricating the semiconductor device according to claim 1, further comprising:
   forming another photoresist layer on the substrate, wherein the another photoresist layer completely covering the first patterns, and partially covering the second patterns and the third patterns; and
   performing another etching process on the second patterns and the third patterns through the another photoresist layer.

3. The method of fabricating the semiconductor device according to claim 1, further comprising:
   forming another photoresist layer on the substrate, covering the first patterns, the second patterns, and the third patterns, wherein the another photoresist layer comprises a first photoresist layer and a second photoresist layer disposed on the first photoresist layer, the first photoresist layer comprises a plurality of openings, and a portion of each of the first patterns is exposed from each of the openings; and
   performing another etching process on the first mask layer and the substrate through the another photoresist layer, the first patterns, the second patterns, and the third patterns, to form the active structure.

4. The method of fabricating the semiconductor device according to claim 3, wherein the first photoresist layer further comprises a plurality of trenches, and the second patterns and the third patterns are partially exposed from the trenches respectively.

5. The method of fabricating the semiconductor device according to claim 4, wherein the openings are sequentially arranged along the first direction, and the trenches are sequentially arranged in the second direction or the third direction.

6. The method of fabricating the semiconductor device according to claim 4, wherein a diameter of the openings is different from a diameter of the trenches.

7. The method of fabricating the semiconductor device according to claim 1, wherein the first edge or the second edge of the second active area comprises a battlement-shaped contour, and the battlement-shaped contour does not directly contact the active area units.

8. The method of fabricating the semiconductor device according to claim 1, wherein the second active area comprises a plurality of trenches, each of the trenches disposed on the first edge or the second edge of the second active area.

9. The method of fabricating the semiconductor device according to claim 8, wherein each of the trenches comprises the same diameter.

10. The method of fabricating the semiconductor device according to claim 8, wherein the trenches comprise different diameters.

* * * * *